United States Patent [19]
Gans et al.

[11] Patent Number: 6,130,811
[45] Date of Patent: *Oct. 10, 2000

[54] DEVICE AND METHOD FOR PROTECTING AN INTEGRATED CIRCUIT DURING AN ESD EVENT

[75] Inventors: Dean Gans; Ken Marr, both of Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/780,422

[22] Filed: Jan. 7, 1997

[51] Int. Cl.$^7$ ........................................... H02H 3/00
[52] U.S. Cl. ................................................. 361/56
[58] Field of Search ..................... 361/18, 56, 58, 361/91, 111, 118, 119, 91.1, 91.2, 91.5; 257/355–358

[56] References Cited

U.S. PATENT DOCUMENTS

| | | | |
|---|---|---|---|
| 5,479,039 | 12/1995 | Lien | 257/356 |
| 5,610,790 | 3/1997 | Staab et al. | 361/56 |
| 5,729,419 | 3/1998 | Lien | 361/111 |

Primary Examiner—Ronald W. Leja
Attorney, Agent, or Firm—Schwegman, Lundberg, Woessner & Kluth, P.A.

[57] ABSTRACT

An integrated circuit having a voltage protection circuit in electrical communication with an input buffer of the integrated circuit and a method for providing voltage protection to the input buffer are disposed. In one exemplary embodiment, the voltage protection circuit is an active device, such as a transistor, in electrical communication with an input node of the input buffer. When the active device actuates it provides a current path which limits a potential seen at the input buffer to a value less than an electrostatic discharge (ESD) potential. In one implementation the active device responds to a voltage which develops in response to current flow in an ESD circuit, and in a further implementation it responds to a gate to source potential during an ESD event. In both implementations the active device is actuated during an ESD event and is deactuated during normal operation of the circuit. In a further exemplary embodiment an isolation circuit is interposed between a supply node of the input buffer and the input buffer. When no external power is applied to the supply node the isolation circuit is open, isolating the input buffer from the supply node. The potential of the bond pad is divided between the gate oxide of internal buffer transistors and the isolation circuit. The voltage protection circuit of the invention ensures that the input potential to the input buffer is less than a breakdown voltage of the input buffer.

45 Claims, 8 Drawing Sheets

DEVICE AND METHOD FOR PROTECTING AN INTEGRATED CIRCUIT DURING AN ESD EVENT

FIELD OF THE INVENTION

The invention relates to integrated circuits, and more particularly to electrostatic protection circuits.

BACKGROUND OF THE INVENTION

Integrated circuits are connectable to "the outside world" through bond pads, also referred to as die terminals, die pads, or contact pads. An input buffer, often configured as an invertor, is interposed between the bond pad and active circuitry of the integrated circuit. The input buffer is comprised of buffer transistors which should be protected from voltages caused by electrostatic discharge (ESD) during handling and testing of the integrated circuit. Subjecting a device to ESD is referred to as an ESD event. Typically, an ESD circuit, which is well known in the art, is connected at the bond pad. The ESD circuit is a protection device typically comprised of diodes connected back to back at the bond pad. The ESD circuit protects the buffer transistors from high voltages caused by an ESD event. The ESD circuit keeps the potential of the bond pad from exceeding a maximum value.

Figure 1:
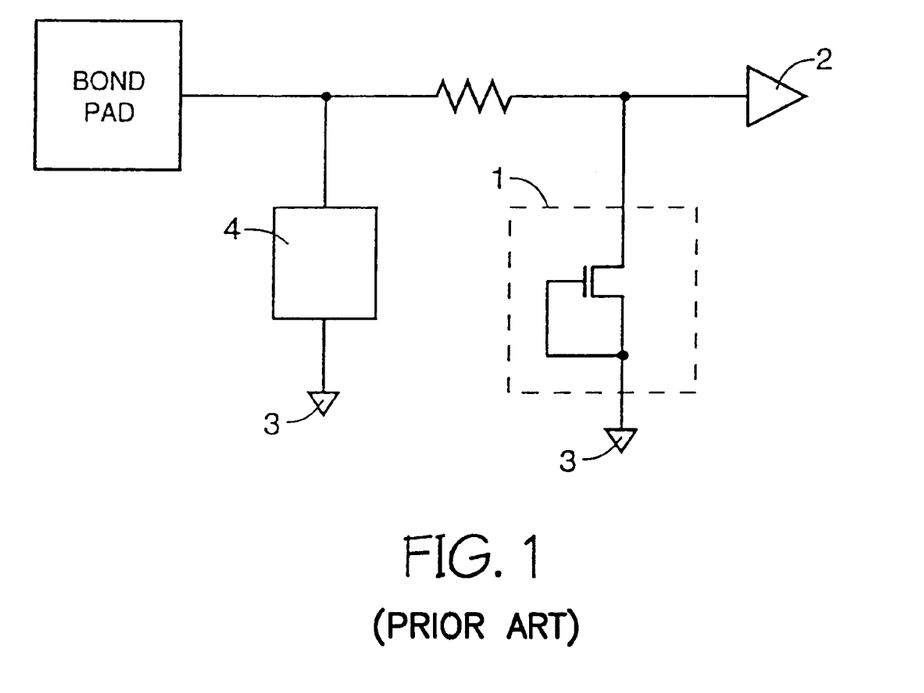
FIG. 1 is a schematic of a circuit of the related art.

In one application shown in FIG. 1, a diode 1 is interposed between the input to the input buffer 2 and a reference node 3. During handling the integrated circuit is not connected to any electrical potentials, and the potential of the reference node 3 is floating. During an ESD event a potential difference develops across the diode 4. If this potential difference is large enough diode 4 is reversed biased allowing the electrostatic current to shunt the active circuitry and buffer transistors of the integrated circuit. However, the diode breakdown voltage may be greater than the breakdown potential of the buffer transistors.

Thus, although the ESD circuit is designed to withstand high current levels, the bond pad potential may be greater than the breakdown voltage of the buffer transistor. This is especially true for a buffer transistor fabricated using current technologies, in which case the thickness of the gate insulator of the buffer transistor has decreased from the thickness obtained using previous fabrication technologies. As the thickness of the gate insulator decreases, the breakdown voltage of the gate insulator decreases. Thus, the breakdown voltage of the buffer transistor is often below the potential established on the bond pad by the ESD circuit.

Thus, a need exists to provide a voltage protection circuit which eliminates breakdown of buffer transistors having low breakdown voltages.

SUMMARY OF THE INVENTION

The invention provides an integrated circuit having a voltage protection circuit and a method for providing voltage protection to the input buffer. The voltage protection circuit of the invention limits a potential seen at the input buffer input node to a value less than a value provided by an electrostatic discharge (ESD) circuit. The input buffer is interposed between a bond pad and active circuitry of an integrated circuit.

In a first currently envisioned exemplary embodiment, an active device, such as a transistor, is interposed between an input node to the input buffer and a supply node. In one implementation the active device responds to current generated in the ESD circuit. A potential develops at a control input of the active device as a result of the current in the ESD circuit, and the active device actuates. In a further implementation of the first embodiment the potential of the control input floats during an ESD event and the active device actuates in response to the generation of. a potential on the bond pad. In both implementations the active device is deactuated during normal operation. In both implementations the actuated active device and an input resistor provide a current path and hence a voltage divider circuit to reduce the potential at the input buffer input node to a value well below the breakdown voltage of the input buffer.

In a second currently envisioned exemplary embodiment of the invention an isolation circuit is interposed between a supply node of the input buffer and the input buffer. When no external power is applied to the supply node, the isolation circuit is open isolating the input buffer from the supply node. The potential of the bond pad is divided between the gate oxide of internal buffer transistors and the isolation circuit. Thus, the input buffer is protected during the ESD event.

DETAILED DESCRIPTION OF PREFERRED EMBODIMENTS

An active device is a device, such as a transistor, which has a control input whose potential or current actively determines its actuation and deactuation. A passive device is a device, such as a transistor configured as a diode, in which there is essentially no control input. When a MOSFET transistor is configured as a diode the gate is connected to the same potential as the source, see diode 1 in FIG. 1.

In a first currently envisioned exemplary embodiment the invention provides an integrated circuit having a voltage protection circuit in electrical communication with an input buffer. The voltage protection circuit of the invention limits a potential seen at an input buffer input node to a value less than a value provided by an electrostatic discharge (ESD) circuit. The input buffer is interposed between a bond pad and internal active circuitry of the integrated circuit which, for example, performs memory functions during normal circuit operation.

Figure 2:
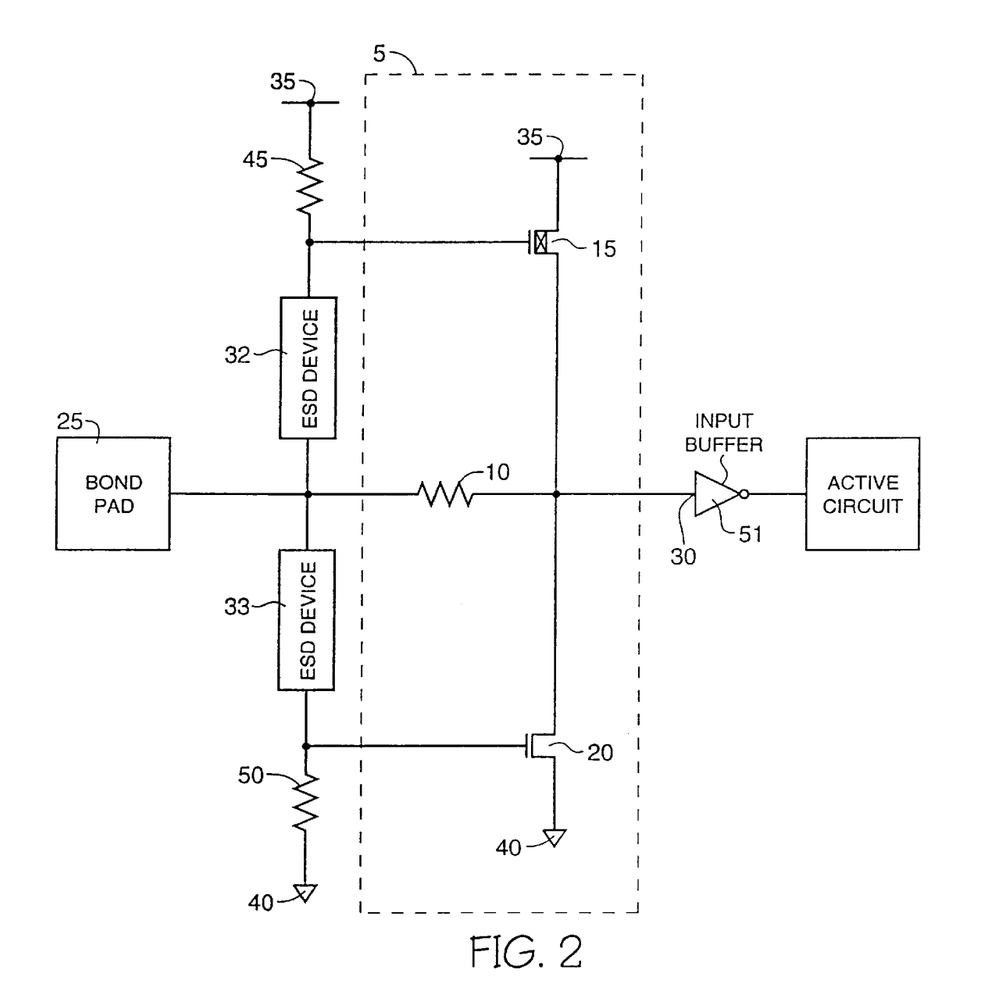
FIG. 2 is a schematic of a first implementation of a first exemplary embodiment of the invention.

One implementation of the first embodiment is an integrated circuit, shown in FIG. 2, having voltage protection circuit 5 which provides a current path through an input resistor 10. Voltage protection circuit 5 comprises pass transistors 15 and 20 and input resistor 10. Pass transistor 15 is a p-channel MOS transistor and is interposed between an input node 30 of input buffer 51 and a supply node 35. Supply node 35 (and any further nodes designated as supply nodes) is preferably connected, during normal circuit operation, to a supply potential, Vcc, between 2.5 Volts and 5 volts, although the value of the supply potential can fall outside this range without departing from the spirit and scope of the invention. Pass transistor 20 is an n-channel MOS transistor and is interposed between the input node 30 and a reference node 40. Reference node 40 (and any further nodes designated as reference nodes) is preferably connected, during normal circuit operation, to a ground reference potential, although other potentials may be used. Supply node 35 and reference node 40 remain unconnected from the supply potential and the reference potential, respectively, during handling. The input resistor 10 is interposed between bond pad 25 and the input buffer input node 30. Electrostatic discharge (ESD) circuits 32 and 33 create a bond pad potential at bond pad 25 in response to an ESD event. The ESD circuits 32 and 33 are designed to conduct large currents and maintain the bond pad potential at or less than a maximum potential determined by the circuitry of the ESD circuits 32 and 33. A potential develops across resistors 45 or 50 as a result of current in ESD circuits 32 or 33, respectively. Resistors 45 and 50 are inherently created during the fabrication of the ESD circuits 32 and 33, respectively. However resistors may be fabricated to perform the same function as resistor 45 and 50. The gate of transistor 15 is connected between resistor 45 and ESD circuit 32, and the gate of transistor 20 is connected between resistor 50 and ESD circuit 33. Transistor 15 or 20 actuates in response to a potential which develops across either resistor 45 or 50, respectively, during an ESD event. Current flows through resistor 10 during the actuation of transistor 15 or 20, thereby reducing the potential seen at node 30 to a value less than the bond pad potential. Thus, the potential at input node 30 is decreased from a value of the bond pad potential to a value below a potential which could cause the input buffer 51 to fail.

During normal operation no current flows through the ESD devices 32 and 33, and the potentials on the gates of pass transistors 15 and 20 remain at the same potential of the nodes 35 and 40, respectively. Thus, transistors 15 and 20 are deactuated during normal circuit operation.

Figure 3A:
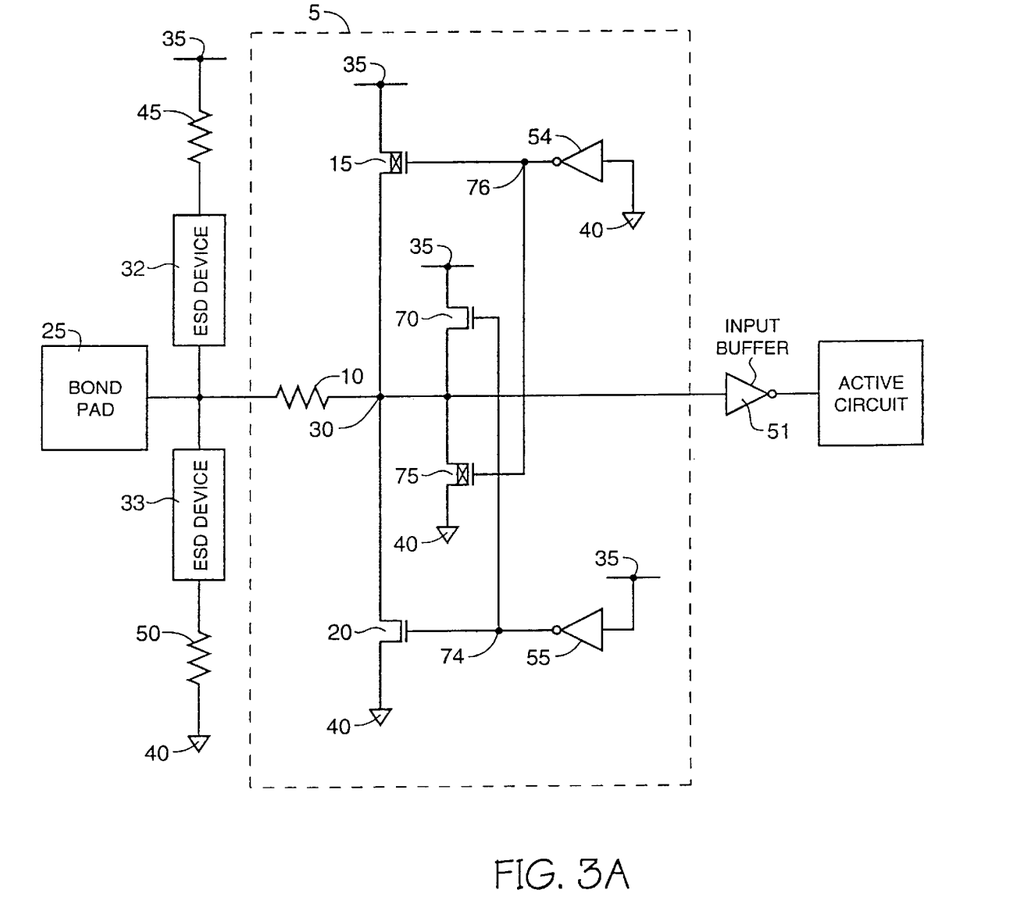
FIGS. 3A–B are schematics of a second implementation of the first embodiment.
Figure 3B:
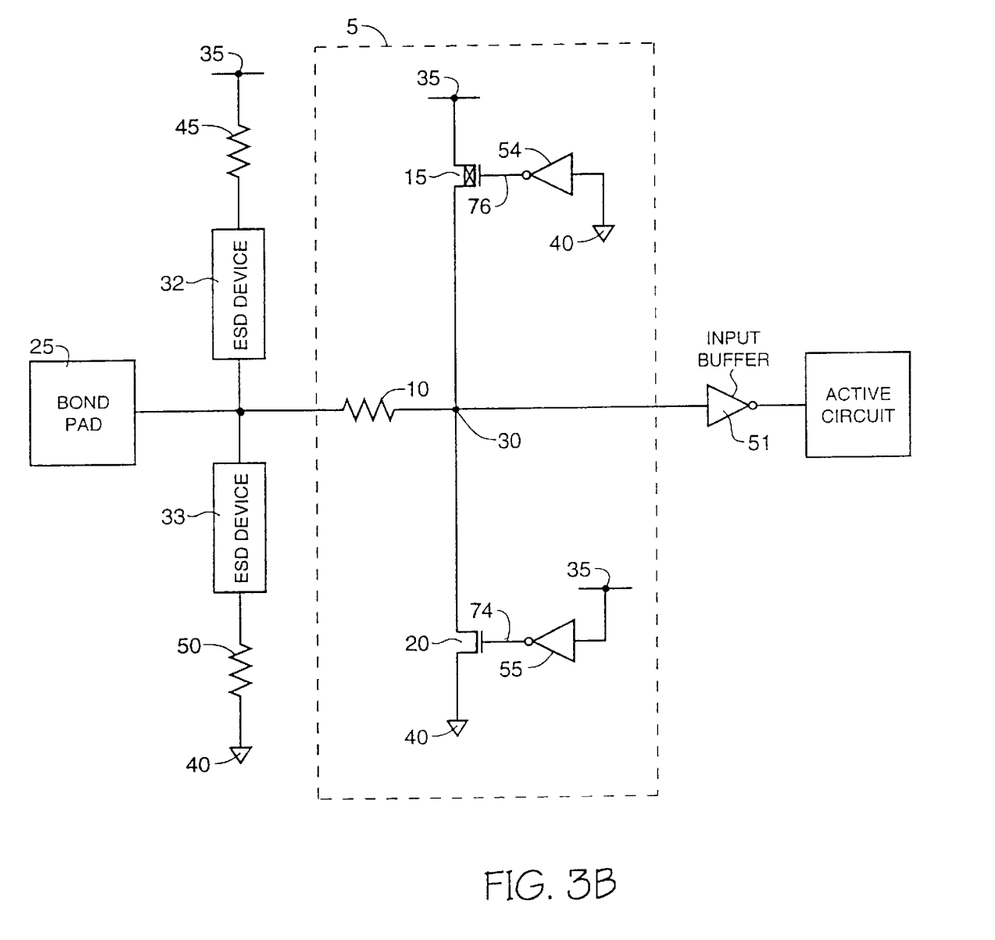

A second implementation of the integrated circuit of the first embodiment is shown in FIGS. 3A–B. Corresponding components are numbered the same in FIGS. 2 and 3A–B. In FIG. 3A p-channel MOS transistor 15 and n-channel MOS transistor 70 are interposed between input node 30 and supply node 35, and n-channel MOS transistor 20 and p-channel MOS transistor 75 are interposed between input node 30 and reference node 40. The gates of transistors 70 and 20 are connected to input node 74 of invertor 55 which is connected to supply node 35, and the gates of transistors 15 and 75 are connected to the input 76 of invertor 54 which is connected to reference node 40. In the case where an even number of serially connected invertors are used to connect the gates the serially connected invertors are connected to the opposite supply nodes of those shown in FIGS. 3A–B. FIGS. 3A–B show the supply and reference node connections for an odd number of serially connected invertors. In either case, when the supply and reference potentials are not applied to supply node 35 and reference node 40, respectively, the potentials of gates at nodes 74 and 76 are floating at opposite potentials since invertors 55 and 54 are designed to be identical. Thus one set of transistors, 15 and 75 or 20 and 70, actuates when one of the ESD devices 32 or 33 drives a potential to the bond pad during an ESD event. The actuation of one pair of transistors provides a current path allowing resistor 10 to conduct current. A voltage drop occurs across the input resistor 10 thereby reducing the input potential seen by the input buffer 51. Thus the input buffer 51 is protected from ESD potentials greater than the buffer breakdown potential; and active transistors 15, 20, 70 and 75, resistor 10, and invertors 54 and 55 function as voltage protection circuit 5.

During normal operation of the circuit the reference node 40 is connected to a reference potential and the supply node 35 is connected to a supply potential, thereby deactuating all of the transistors 15, 20, 70 and 75. During handling nodes 35 and 40 are not connected to supply and reference potentials.

The circuit of FIG. 3B is similar to that of FIG. 3A with the omission of transistors 70 and 75. As was the case in FIG. 3A the potentials of the gates at nodes 74 and 76 are driven by matched invertors 55 and 54, respectively. Therefore, when the supply and reference potentials are not applied to supply node 35 and reference node 40, respectively, the potentials of the gates at nodes 74 and 76 float. At least one of the ESD circuits 32 or 33 generates a potential at the bond pad 25 during an ESD event. In response to the bond pad potential, one of the pass transistors 15 or 20 actuates and current flows through resistor 10. A voltage drop occurs across resistor 10 thereby reducing the potential seen by the input buffer 51. Thus, the input buffer 51 is protected from ESD potentials greater than the buffer breakdown potential; and active transistors 15 and 20, resistor 10, and invertors 54 and 55 function as a voltage protection circuit 5.

During normal operation of the integrated circuit, the reference node 40 is connected to a reference potential and the supply node 35 is connected to a supply potential, thereby deactuating transistors 70 and 75 of FIG. 3A. As is the case in the first embodiment, during handling nodes 35 and 40 are not connected to supply and reference potentials.

Figure 4A:
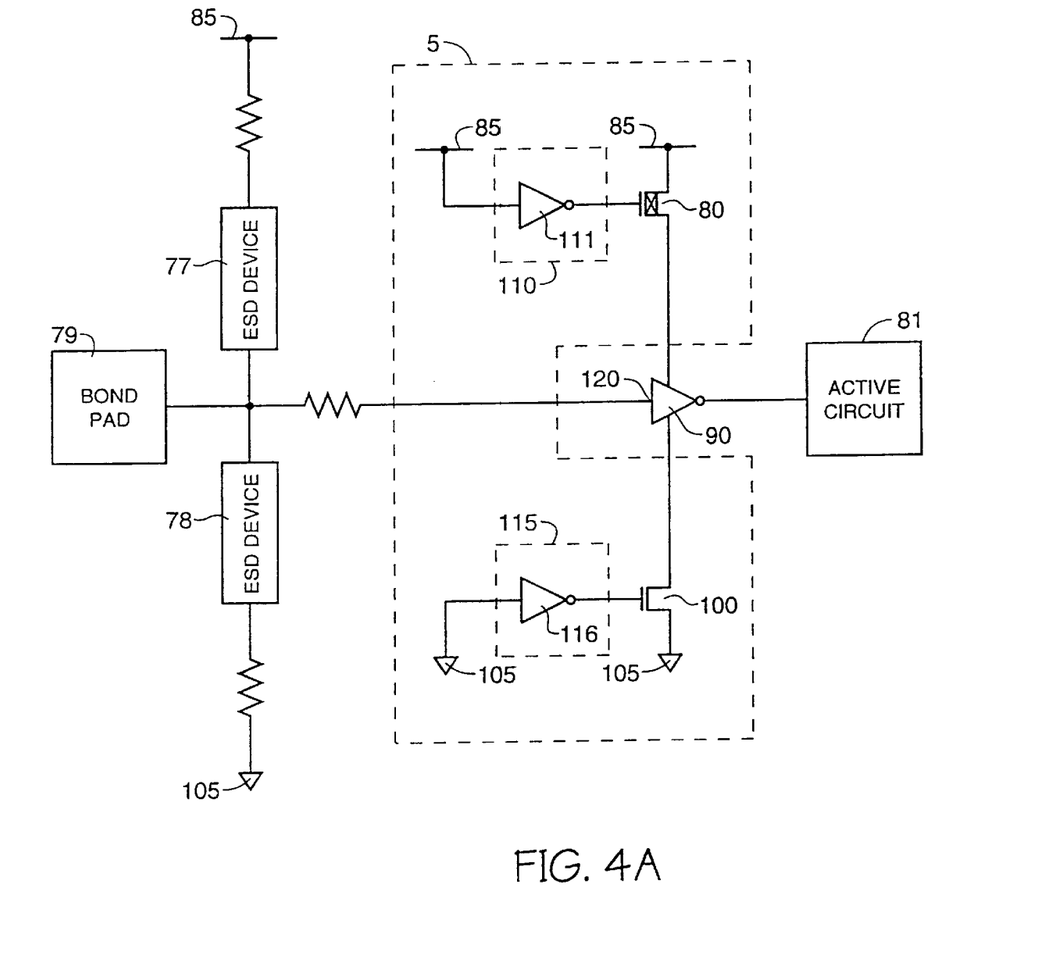
FIGS. 4A–C are schematics of a second exemplary embodiment of the invention.
Figure 4B:
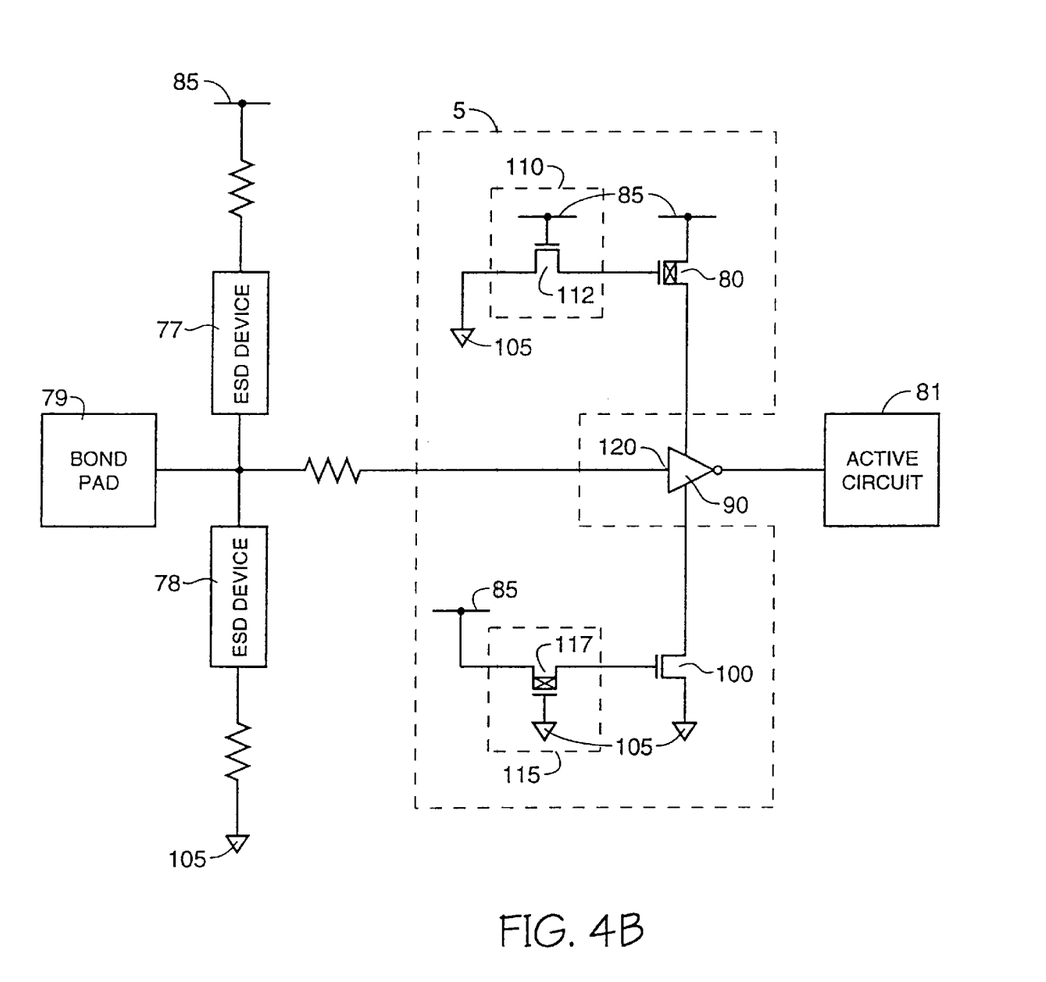
Figure 4C:
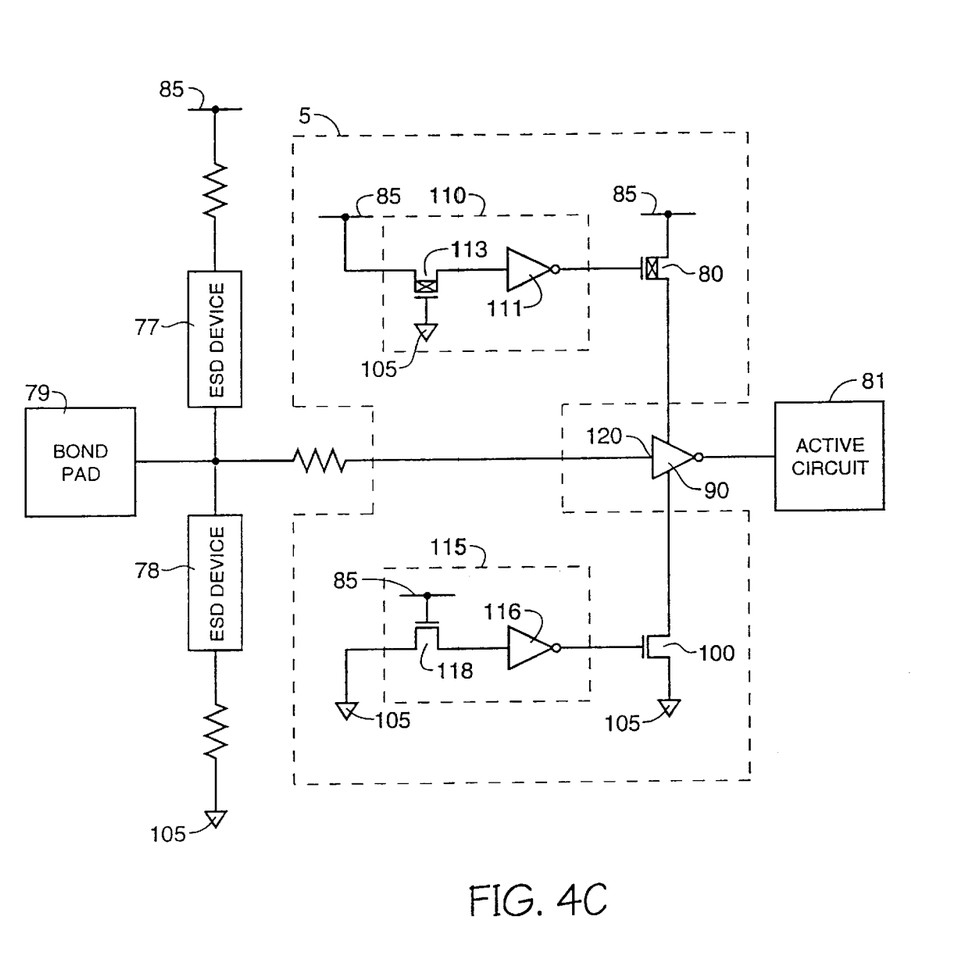

In a further currently envisioned exemplary embodiment, shown in FIGS. 4A–C, the invention provides an integrated circuit having a voltage protection circuit in electrical communication with an input buffer. Corresponding elements are numbered the same in FIGS. 4A–C. The voltage protection circuit 5 of the invention limits a potential seen at an input buffer input node to a value less than a value provided by an electrostatic discharge (ESD) circuit. The input buffer 90 is interposed between a bond pad 79 and internal active circuitry 81 of the integrated circuit.

At least one of the ESD circuits 77 or 78 generates a reduced ESD potential at the bond pad 79 during an ESD event. A MOS p-channel first isolation transistor 80 is interposed between a supply node 85 and the input buffer 90, and a MOS n-channel second isolation transistor 100 is interposed between a reference node 105 and the input buffer 90. Control circuit 110 is interposed between supply node 85 and the gate of transistor 80, and control circuit 115 is interposed between reference node 105 and the gate of transistor 100.

In FIG. 4A the control circuit 110 is an invertor 111 interposed between the gate of isolation transistor 80 and supply node 85, and the control circuit 115 is an invertor 116 interposed between the gate of isolation transistor 100 and reference node 105.

In FIG. 4B the control circuit 110 is an n-channel MOS transistor 112 interposed between reference node 105 and the gate of isolation transistor 80, and control circuit 115 is a p-channel MOS transistor 117 interposed between the gate of isolation transistor 100 and supply node 85. The gate of transistor 112 is connected to supply node 85, and the gate of transistor 117 is connected to reference node 105.

In FIG. 4C control circuit 110 is the same as that shown in FIG. 4A except for the addition of a p-channel MOS transistor 113 interposed between the supply node 85 and invertor 111, and control circuit 115 is the same as that shown in FIG. 4A except for the addition of an n-channel MOS transistor 118 interposed between invertor 116 and reference node 105. The gate of transistor 113 is connected to reference node 105, and the gate of transistor 118 is connected to supply node 85. Referring to FIGS. 4A–C, when there is no external power applied to supply node 85 and reference node 105, the isolation transistors 80 and 100 are deactuated isolating the input buffer 90 from the supply node 85 and the reference node 105. When the input buffer 90 is isolated from supply node 85 and reference node 105, the bond pad potential is divided between the gate oxide of internal transistors of the input buffer 90 and the isolation transistors 80 and 100. Thus the input buffer 90 is protected during the ESD event since its internal transistors do not see the entire bond pad potential generated by ESD devices 77 and 78. The potential they do see is less than their breakdown voltage. In this embodiment the isolation transistors 80 and 100 and the control circuits 110 and 115 function as the voltage protection circuits of the invention.

During normal circuit operation, supply nodes 85 is connected to Vcc, and reference node 105 is connected to ground. When powered transistors 80 and 100 actuate coupling the input buffer 90 to Vcc and ground.

Figure 5:
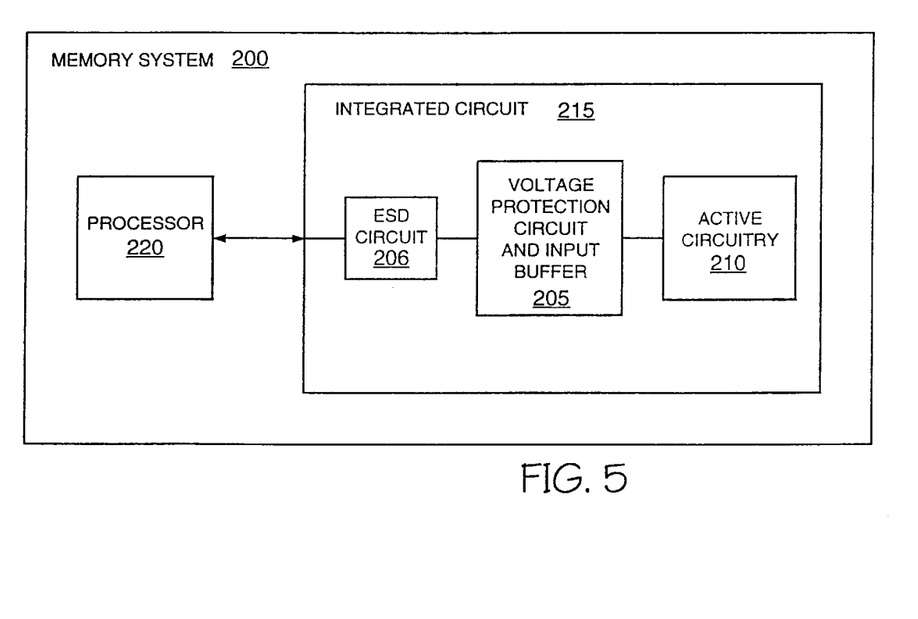
FIG. 5 is a block schematic of a memory system of the invention.

Referring to FIG. 5, the invention also provides a memory system 200 comprising the voltage protection circuit and input buffer 205 of the invention. The voltage protection circuit and input buffer 205, ESD circuit 206, and active circuitry 210 form an integrated circuit 215. The voltage protection circuit and input buffer 205 protect the active circuitry 210 during an ESD event. The integrated circuit 215 and a processor 220 form at least part of the memory system 200. The processor 220 is used to generate control signals which drive the integrated circuit 215 during normal circuit operation.

It is to be understood that although the present invention has been described with reference to preferred embodiments, various modifications to these with reference to preferred embodiments, various modifications to these embodiments may be made without departing from the invention as recited in the claims appended hereto. P-channel devices may be substituted for n-channel devices and vice versa. In this case Vcc and the reference potential would also be switched.

What is claimed is:

1. An integrated circuit, comprising:
    active circuitry;
    a bond pad;
    an input buffer circuit electrically interposed between said active circuitry and said bond pad;
    an electrostatic discharge circuit in electrical communication with said bond pad and configured to control a bond pad potential in response to an electrostatic discharge event; and
    an active voltage protection circuit in electrical communication with said input buffer circuit, the active voltage protection circuit comprising a first transistor comprising a first node, a second node, and a control node, wherein the control node of the first transistor is coupled to the electrostatic discharge circuit such that the first transistor activates in response to a voltage developed across a passive device resulting from a current through the electrostatic discharge circuit, and wherein the active voltage protection circuit limits a potential at the input buffer circuit to a value that is less than a potential limited by the electrostatic discharge circuit.

2. The integrated circuit as specified in claim 1, further comprising a means to deactuate said active voltage protection circuit during normal operation of said active circuitry.

3. The integrated circuit as specified in claim 1, wherein said active voltage protection circuit further comprises a second transistor comprising a first node, a second node, and a control node, wherein the control node of the second transistor is coupled to said electrostatic discharge circuit such that the second transistor activates in response to a voltage developed across a passive device resulting from a current through the electrostatic discharge circuit.

4. The integrated circuit as specified in claim 1, further comprising a resistor interposed between the bond pad and the input buffer circuit.

5. The integrated circuit as specified in claim 1, wherein the passive device comprises a resistance interposed between a supply node and the electrostatic discharge circuit, wherein the control node of the first transistor is directly connected with the electrostatic discharge circuit and said resistance.

6. The integrated circuit as specified in claim 1, wherein:
    said active voltage protection circuit is interposed between the input buffer circuit and a supply node.

7. The integrated circuit as specified in claim 1, wherein the first node of the first transistor is in electrical communication with the input buffer circuit and the second node of the first transistor is in electrical communication with a supply node.

8. An integrated circuit, comprising:
    active circuitry;
    a bond pad in electrical communication with said active circuitry;
    an input buffer circuit electrically interposed between said active circuitry and said bond pad;
    an electrostatic discharge circuit in electrical communication with said bond pad and configured to control a bond pad potential in response to an electrostatic discharge event;
    a first transistor comprising a first control input, wherein the first transistor is directly connected with said input buffer circuit, wherein the first transistor is interposed between the input buffer circuit and a first supply node, and wherein the first control input of the first transistor is in electrical communication with a second supply node, wherein the first control input is coupled to the electrostatic discharge circuit such that the first transistor activates in response to a voltage developed across a passive device resulting from a current through the electrostatic discharge circuit when the first supply node and the second supply node are disconnected from normal operating potentials; and
    a second transistor comprising a second control input, wherein the second transistor is directly connected with the input buffer circuit, wherein the second transistor is interposed between the input buffer circuit and the second supply node, and wherein the second control input of the second transistor is in electrical communication with the first supply node, wherein the second control input is coupled to the electrostatic discharge circuit such that the second transistor activates in response to a voltage developed across a passive device resulting from a current through the electrostatic discharge circuit when the first supply node and the second supply node are disconnected from the normal operating potentials;
    wherein the first and second transistors limit a potential at the input buffer circuit to a value that is less than a potential limited by the electrostatic discharge circuit.

9. The integrated circuit as specified in claim 8, further comprising a means to deactuate said first transistor during normal operation of said active circuitry.

10. The integrated circuit as specified in claim 8, further comprising a resistor interposed between the bond pad and the input buffer circuit.

11. The integrated circuit as specified in claim 8, further comprising:
- a first control circuit connected to the control input of said first transistor; and
- a second control circuit connected to the control input of said second transistor, wherein electrical characteristics of said first and said second control circuits are matched in order to ensure that output potentials of said first and second control circuits are substantially the same during an electrostatic discharge event.

12. An integrated circuit, comprising:
- active circuitry;
- a bond pad in electrical communication with said active circuitry;
- an input buffer circuit electrically interposed between said active circuitry and said bond pad;
- an electrostatic discharge circuit in electrical communication with said bond pad and configured to control a bond pad potential in response to an electrostatic discharge event;
- a first transistor comprising a first control input, wherein the first transistor is in electrical communication with said input buffer circuit, wherein the first transistor is interposed between the input buffer circuit and a first supply node, and wherein the first control input of the first transistor is in electrical communication with a second supply node; and
- a second transistor comprising a second control input, wherein the second transistor is in electrical communication with the input buffer circuit, wherein the second transistor is interposed between the input buffer circuit and the second supply node, and wherein the second control input of the second transistor is in electrical communication with the first supply node,
- wherein an input potential of said input buffer circuit is decreased from a value of the bond pad potential in response to an actuation of said first transistor;
- further comprising a third transistor comprising a third control input, wherein the third transistor is in electrical communication with said input buffer circuit, wherein the third transistor is interposed between the input buffer circuit and the first supply node, and wherein the third control input of the third transistor is in electrical communication with the first supply node; and a fourth transistor comprising a fourth control input, wherein the fourth transistor is in electrical communication with the input buffer circuit, wherein the fourth transistor is interposed between the input buffer circuit and the second supply node, and wherein the fourth control input of the second transistor is in electrical communication with the second supply node.

13. An integrated circuit, comprising:
- active circuitry;
- a bond pad in electrical communication with said active circuitry;
- an input buffer circuit having an input node and electrically interposed between said active circuitry and said bond pad;
- an electrostatic discharge circuit in electrical communication with said bond pad and configured to control a bond pad potential in response to an electrostatic discharge event; and
- a transistor in electrical communication with said input buffer circuit, wherein an input potential of said input buffer circuit is decreased from a value of the bond pad potential in response to an actuation of said transistor,
- wherein said transistor is a first transistor interposed between the input node of said input buffer circuit and a first supply node, a control input of said first transistor in electrical communication with one of the first supply node and a second supply node; and further comprising
- a second transistor interposed between the input node of said input buffer circuit and the second supply node, a control input of said second transistor in electrical communication with the other of the first and second supply nodes;
- a third transistor interposed between the input node of said input buffer circuit and the first supply node, a control input of said third transistor in electrical communication with the control input of said second transistor; and
- a fourth transistor interposed between the input node of said input buffer circuit and the second supply node, a control input of said fourth transistor in electrical communication with the control input of said first transistor.

14. An integrated circuit, comprising:
- active circuitry configured to perform a circuit function;
- a bond pad in electrical communication with said active circuitry;
- an input buffer circuit electrically interposed between said active circuitry and said bond pad;
- a first electrostatic discharge circuit electrically interposed between a first supply node and the bond pad;
- a second electrostatic discharge circuit electrically interposed between a second supply node and the bond pad, wherein said first and said second electrostatic discharge circuits are configured such that at least one of them conducts current in response to an electrostatic discharge event;
- a first path in electrical communication with the bond pad and at least the first supply node, said first path comprising a first active device; and
- a second path in electrical communication with the bond pad and at least the second supply node, said second path comprising a second active device, wherein at least one of said first and second paths is configured to conduct current during an electrostatic discharge event to decrease a potential of said input node to a value less than a bond pad potential,
- wherein said first path further comprises a third active device and wherein said second path further comprises a fourth active device, such that said first and said third active devices are configured to actuate substantially simultaneously and such that said second and fourth active devices are configured to actuate substantially simultaneously.

15. An integrated circuit, comprising:
- active circuitry configured to perform a memory function;
- a bond pad in electrical communication with said active circuitry;
- an input buffer circuit electrically interposed between said active circuitry and said bond pad, said input buffer circuit comprising a supply input node; and
- an isolation circuit interposed between said input buffer circuit and said supply input node to isolate said input buffer circuit from said supply input node during an electrostatic discharge event, wherein the isolation circuit is in electrical communication with the supply input node of the input buffer circuit, wherein the isolation circuit comprises a first transistor comprising a first node, a second node, and a control node, wherein the first node of the first transistor is in electrical communication with the supply input node, and wherein the second node of the first transistor is in electrical communication with the input buffer circuit.

16. The integrated circuit as specified in claim 15, wherein said isolation circuit is configured to couple said input buffer circuit to said supply input node during normal operating conditions of the integrated circuit.

17. An integrated circuit, comprising:
active circuitry configured to perform a memory function;
a bond pad in electrical communication with said active circuitry;
an input buffer circuit electrically interposed between said active circuitry and said bond pad;
an electrostatic discharge circuit configured to control a bond pad potential in response to an occurrence of an electrostatic discharge event; and
a voltage protection circuit in electrical communication with said input buffer circuit, said voltage protection circuit comprising:
a first transistor comprising a first node, a second node, and a control node, wherein the first transistor is interposed between the input buffer circuit and a first supply node, wherein the first node of the first transistor is in electrical communication with the first supply node, and wherein the second node of the first transistor is in electrical communication with internal transistors of the input buffer circuit;
a second transistor comprising a first node, a second node, and a control node, wherein the first node of the second transistor is electrically coupled to the control node of the first transistor, wherein the second node of the second transistor is in electrical communication with the first supply node, and wherein the control node of the second transistor is in electrical communication with a second supply node,
wherein the voltage protection circuit isolates the input buffer circuit from the first supply node during the electrostatic discharge event.

18. The integrated circuit as specified in claim 17, wherein the voltage protection circuit is configured to couple said input buffer circuit to said supply node under normal operating conditions of the integrated circuit.

19. An integrated circuit comprising:
a bond pad;
an active circuit;
an input buffer in electrical communication with the bond pad and the active circuit;
an electrostatic discharge (ESD) circuit in electrical communication with said bond pad to dissipate energy at the bond pad during an ESD event at an electrostatic discharge potential;
potential node that is connected to a potential during ordinary operation of the integrated circuit; and
a voltage protection circuit including at least one transistor that, wherein the voltage protection circuit activates at an active voltage protection potential resulting from a current through the ESD circuit when the potential node is disconnected from the potential, and wherein the active voltage protection potential is less than the electrostatic discharge potential and greater than the breakdown voltage of the input buffer coupled to the active voltage protection circuit.

20. The integrated circuit of claim 19, wherein the potential node is a supply node and the potential is a supply potential.

21. The integrated circuit of claim 19, wherein the potential node is a reference node and the potential is a reference potential.

22. An integrated circuit, comprising:
a die terminal;
an active circuit;
an input buffer circuit in electrical communication with the die terminal and the active circuit;
an electrostatic discharge (ESD) circuit in electrical communication with the die terminal to dissipate energy through a passive impedance device at the die terminal during an ESD event at an electrostatic discharge potential;
a conductor to receive a potential during ordinary operation of the integrated circuit; and
an active voltage protection circuit in electrical communication with said input buffer circuit, the active voltage protection circuit comprising a transistor comprising a first node, a second node, and a control node, wherein the control node of the transistor is coupled to the electrostatic discharge circuit such that the transistor activates in response to a voltage developed across the passive impedance device resulting from a current through the electrostatic discharge circuit when the conductor is disconnected from the potential, and wherein the active voltage protection circuit limits a potential at the input buffer circuit to a value that is less than a potential limited by the electrostatic discharge circuit.

23. The integrated circuit of claim 22, wherein the conductor is a supply conductor and the potential is a supply potential.

24. The integrated circuit of claim 22, wherein the conductor is a reference conductor and the potential is a reference potential.

25. The integrated circuit of claim 22, wherein the die terminal is a bond pad.

26. A memory system, comprising:
a processor for providing a control signal;
a monolithic memory device configured to accept the control signal at a bond pad during normal circuit operation, said monolithic memory device comprising;
active circuitry, in electrical communication with the bond pad, configured to perform a circuit function during the normal circuit operation in response to the control signal;
an input buffer circuit having an input node electrically interposed between said active circuitry and the bond pad;
an electrostatic discharge circuit in electrical communication with the bond pad and configured to control a bond pad potential, in response to an electrostatic discharge event, to not exceed a maximum value;
a first path in electrical communication with the bond pad and at least a first supply node, said first path comprising a first active device; and
a second path in electrical communication with the bond pad and at least a second supply node, said second path comprising a second active device, wherein at least one of said first and second paths is configured to conduct current during an electrostatic discharge event to decrease a potential of said input node to a value less than a bond pad potential, wherein said first path further comprises a third active device and wherein said second path further comprises a fourth active device, such that said first and said third active devices are configured to actuate substantially simultaneously and such that said second and fourth active devices are configured to actuate substantially simultaneously.

27. A method for protecting an input buffer from a breakdown potential during an application of an electrostatic discharge potential on a bond pad of an integrated circuit, comprising:

conducting current in an electrostatic discharge device in response to the electrostatic discharge potential;

controlling the potential on the bond pad to a value less than the electrostatic discharge potential;

providing a potential at a control input of a first and a second active device;

actuating, in response to the potential at the control input, the first active device in a first path that is directly connected with the bond pad and at least a first supply node;

actuating the second active device in the first path substantially simultaneously with the step of actuating the first active device; and driving a potential at an input node of the input buffer to a value less than the potential of the bond pad.

28. An integrated circuit, comprising:

an electrostatic discharge circuit in electrically communication with bond pad of the integrated circuit, the bond pad having a bond pad potential, wherein the electrostatic discharge circuit is configured to control the bond pad potential in response to an electrostatic discharge event; and an active voltage protection circuit in electrical communication with an input buffer circuit of the integrated circuit, the input buffer circuit electrically interposed between an active circuitry of the integrated circuit and the bond pad, wherein the active voltage protection circuit comprise a first transistor comprising a first node, a second node, and a control node, wherein the control node of the first transistor is coupled to the electrostatic discharge circuit such that the first transistor activates in response to a voltage developed across a passive device resulting from a current through the electrostatic discharge circuit, and wherein the active voltage protection circuit limits a potential at the input buffer circuit to a value that is less than a potential limited by the electrostatic discharge circuit.

29. The integrated circuit of claim 28, wherein the active voltage protection circuit deactuates during normal operation of the active circuitry.

30. The integrated circuit of claim 28, wherein the active voltage protection circuit further comprises a second transistor comprising a first node, a second node, and a control node, wherein the control node of the second transistor is coupled to the electrostatic discharge circuit such that the second transistor activates in response to a voltage developed across a passive device resulting from a current through the electrostatic discharge circuit.

31. The integrated circuit of claim 28, wherein the active voltage protection circuit is interposed between the input buffer circuit and a supply node.

32. The integrated circuit of claim 28, wherein the first node of the first transistor is directly connected with the input buffer circuit and the second node of the first transistor is directly connected with a supply node.

33. An integrated circuit, comprising:

an electrostatic discharge circuit in electrical communication with a bond pad of the integrated circuit, the bond pad having a bond pad potential, wherein the electrostatic discharge circuit is configured to control a bond pad potential in response to an electrostatic discharge event;

a first transistor comprising a first control input, wherein the first transistor is directly connected with an input buffer circuit of the integrated circuit, the input buffer circuit electrically interposed between an active circuitry of the integrated circuit and the bond pad, wherein the first transistor is interposed between the input buffer circuit and a first supply node, and wherein the first control input of the first transistor is coupled with a second supply node; and a second transistor comprising a second control input, wherein the second transistor is directly connected with the input buffer circuit, wherein the second transistor is interposed between the input buffer circuit and the second supply node, and wherein the second control input of the second transistor is coupled with the first supply node, wherein the first and second transistors limit a potential at the input buffer circuit to a value that is less than a potential limited by the electrostatic discharge circuit.

34. The integrated circuit of claim 33, wherein the first transistor deactuates during normal operation of the active circuitry.

35. An integrated circuit, comprising:

an electrostatic discharge circuit in electrical communication with a bond pad of the integrated circuit, the bond pad having a bond pad potential, wherein the electrostatic discharge circuit is configured to control a bond pad potential in response to an electrostatic discharge event;

a first transistor comprising a first control input, wherein the first transistor is directly connected with an input buffer circuit of the integrated circuit, the input buffer circuit electrically interposed between an active circuitry of the integrated circuit and the bond pad, wherein the first transistor is interposed between the input buffer circuit and a first supply node, and wherein the first control input of the first transistor is coupled with a second supply node; and a second transistor comprising a second control input, wherein the second transistor is directly connected with the input buffer circuit, wherein the second transistor is interposed between the input buffer circuit and the second supply node, and wherein the second control input of the second transistor is coupled with the first supply node, wherein an input potential of said input buffer circuit is decreased from a value of the bond pad potential in response to an actuation of said first transistor, a third transistor comprising a third control input, wherein the third transistor is in electrical communication with the input buffer circuit, wherein the third transistor is interposed between the input buffer circuit and the first supply node, and wherein the third control input is in electrical communication with the first supply node; and a fourth transistor comprising a fourth control input, wherein the fourth transistor is in electrical communication with the input buffer circuit, wherein the fourth transistor is interposed between the input buffer circuit and the second supply node, and wherein the fourth control input is in electrical communication with the second supply node.

36. The integrated circuit of claim 33, further comprising a resistor interposed between the bond pad and the input buffer circuit.

37. An integrated circuit, comprising:

an electrostatic discharge (ESD) circuit in electrical communication with a bond pad of the integrated circuit, the ESD circuit capable of dissipating energy at the bond pad during an ESD event at an electrostatic discharge potential;

a potential node that is connected to a potential during ordinary operation of the integrated circuit; and a voltage protection circuit including at least one transistor that when activated provides a current path between the bond pad and the potential node when the potential is disconnected from the potential node, wherein the voltage protection circuit activates at an active voltage protection potential in response to a voltage developed across a passive device in the ESD circuit resulting from a current through the ESD circuit, wherein the active voltage protection potential is less than the electrostatic discharge potential and greater than the breakdown voltage of an input buffer coupled to the active voltage protection circuit, wherein the at least one transistor comprises a first node, a second node and a control node, wherein the first node is directly connected with the potential node, wherein the control node is coupled to the potential node, and wherein the second node is directly connected with a number of internal transistors of the input buffer of the integrated circuit, the input buffer directly connected with the bond bad and an active circuit of the integrated circuit.

38. The integrated circuit of claim 37, wherein the potential node is a supply node and the potential is a supply potential.

39. The integrated circuit of claim 37, wherein the potential node is a reference node and the potential is a reference potential.

40. An integrated circuit, comprising:

an electrostatic discharge (ESD) circuit in electrical communication with a die terminal of the integrated circuit, the ESD circuit capable of dissipating energy at the die terminal during an ESD event at an electrostatic discharge potential;

a conductor that receives a potential during ordinary operation of the integrated circuit; and a voltage protection circuit including at least one transistor that when activated reduces voltage received by an input buffer of the integrated circuit, the input buffer in electrical communication with the die terminal, the voltage protection circuit being activated when the potential is disconnected from the conductor and at an active voltage protection potential in response to a voltage developed across a passive device in the ESD circuit resulting from a current through the ESD circuit, wherein the active voltage protection potential is less than the electrostatic discharge potential and greater than a breakdown voltage of the input buffer, wherein the at least one transistor comprises a first node, a second node and a control node, wherein the first node and the control node are coupled with the potential, and wherein the second node is directly connected with a number of internal transistors of the input buffer.

41. The integrated circuit of claim 40, wherein the conductor is a supply conductor and the potential is a supply potential.

42. The integrated circuit of claim 40, wherein the conductor is a reference conductor and the potential is a reference potential.

43. An integrated circuit, comprising:

an electrostatic discharge (ESD) circuit coupled to a bond pad of the integrated circuit and configured to control a bond pad potential in response to an electrostatic discharge event, wherein the ESD circuit activates at a electrostatic discharge potential; and an active voltage protection circuit coupled to an input buffer of the integrated circuit and the ESD circuit, wherein the active voltage protection circuit is actuated at an active voltage protection potential resulting from a current through the ESD circuit when normal operating supply nodes of the integrated circuit are disconnected from their respective normal operating potentials, wherein the active voltage protection potential is less than the electrostatic discharge potential and greater than a breakdown voltage of the input buffer.

44. A memory system, comprising:

a processor for providing a control signal; and a memory device configured to accept the control signal at a bond pad during normal circuit operation, the memory device comprising;

an electrostatic discharge (ESD) circuit coupled to the bond pad and configured to control a bond pad potential in response to an electrostatic discharge event, wherein the ESD circuit activates at a electrostatic discharge potential; and an active voltage protection circuit coupled to an input buffer of the memory device and the ESD circuit, wherein the active voltage protection circuit is actuated at an active voltage protection potential resulting from a current through the ESD circuit when normal operating potentials, wherein the active voltage protection potential is less than the electrostatic discharge potential and greater than a breakdown voltage of the input buffer.

45. A method for electrostatic protection, the method comprising:

conducting current in an electrostatic discharge device in response to an electrostatic discharge potential; and conducting current in an active voltage protection circuit in response to an active voltage protection potential resulting from a current through the electrostatic discharge device when normal operating supply nodes of the integrated circuit are disconnected from their respective normal operating potentials, the active voltage protection potential less than the electrostatic discharge potential and greater than a breakdown voltage of an input buffer coupled to the active voltage protection circuit.

* * * * *

UNITED STATES PATENT AND TRADEMARK OFFICE
CERTIFICATE OF CORRECTION

PATENT NO.: 6,130,811

DATED: Oct. 10, 2000

INVENTOR(S): Gans et al.

It is certified that error appears in the above identified patent and that said Letters Patent is hereby corrected as shown below:

In column 14, line 43, delete "when normal operating potentials" and insert -- when normal operating supply nodes of the memory device are disconnected from their respective normal operating potentials--, therefore.

Signed and Sealed this

Eighth Day of May, 2001

Attest:

NICHOLAS P. GODICI

Attesting Officer

Acting Director of the United States Patent and Trademark Office